(12) United States Patent
Zentai et al.

(10) Patent No.: US 8,232,531 B2
(45) Date of Patent: Jul. 31, 2012

(54) CORROSION BARRIER LAYER FOR PHOTOCONDUCTIVE X-RAY IMAGERS

(75) Inventors: George Zentai, Mountain View, CA (US); Larry Partain, Los Altos, CA (US); William Wei-Yu Yao, Los Altos, CA (US); Richard Weisfield, Los Altos, CA (US)

(73) Assignees: Varian Medical Systems, Inc., Palo Alto, CA (US); dpiX, LLC, Palo Alto, CA (US)

( * ) Notice: Subject to any disclaimer, the term of this patent is extended or adjusted under 35 U.S.C. 154(b) by 824 days.

(21) Appl. No.: 11/731,170

(22) Filed: Mar. 29, 2007

(65) Prior Publication Data

US 2008/0237481 A1 Oct. 2, 2008

(51) Int. Cl.
*H01L 25/00* (2006.01)
(52) U.S. Cl. .................................. 250/370.12
(58) Field of Classification Search ..... 250/370.01–370.15, 378, 363.01–363.1, 250/318, 208.1–208; 378/98.2–98.12
See application file for complete search history.

(56) References Cited

U.S. PATENT DOCUMENTS

| | | | |
|---|---|---|---|
| 5,061,973 A | 10/1991 | Chu | |
| 5,127,038 A | 6/1992 | Jeromin et al. | |
| 5,151,390 A * | 9/1992 | Aoki et al. | 501/95.1 |
| 5,166,524 A | 11/1992 | Lee et al. | |
| 5,168,160 A | 12/1992 | Jeromin et al. | |
| 5,313,066 A | 5/1994 | Lee et al. | |
| 5,331,179 A | 7/1994 | Lee et al. | |
| 5,396,072 A | 3/1995 | Schiebel et al. | |
| 5,498,880 A * | 3/1996 | Lee et al. | 250/580 |
| 5,556,716 A | 9/1996 | Herron et al. | |
| 5,563,092 A * | 10/1996 | Ohmi | 438/485 |
| 5,729,021 A * | 3/1998 | Brauers et al. | 250/370.09 |
| 5,859,463 A * | 1/1999 | Liu et al. | 257/448 |
| 5,886,353 A | 3/1999 | Spivey et al. | |
| 5,892,227 A | 4/1999 | Schieber et al. | |
| 5,925,890 A | 7/1999 | Van den Boggaert et al. | |
| 6,037,609 A * | 3/2000 | Liu et al. | 257/59 |

(Continued)

FOREIGN PATENT DOCUMENTS

JP 10200143 A * 7/1998

(Continued)

OTHER PUBLICATIONS

Fundamentals of Physics, Halliday et al., 7th Edition, John Wiley & Sons, Inc. ISBN 0-471-21643-7, (2005).*

(Continued)

*Primary Examiner* — Kiho Kim
(74) *Attorney, Agent, or Firm* — Lumen Patent Firm

(57) ABSTRACT

Improved corrosion resistance for direct X-ray imaging detectors is obtained by providing a pixelated, electrically conductive barrier layer between the X-ray sensitive material and the pixel electrodes. Each barrier layer can cover part or all of its corresponding pixel electrode. In cases where pixel electrodes makes contact to underlying circuitry through vertical vias, it is preferred for the barrier layers to cover the via sections of the pixel electrodes. The barrier layers for each pixel electrode can be spaced apart from each other, or they can all be included within a continuous film on top of the pixel electrodes. Such a continuous film can be pixelated by spatially modulating its properties (e.g., thickness, doping) to significantly reduce lateral conductivity from pixel to pixel.

13 Claims, 2 Drawing Sheets

U.S. PATENT DOCUMENTS

| | | | |
|---|---|---|---|
| 6,147,391 A | 11/2000 | Bowers et al. | |
| 6,180,529 B1 * | 1/2001 | Gu | 438/706 |
| 6,306,739 B1 | 10/2001 | Alexander | |
| 6,348,693 B1 * | 2/2002 | Weisfield et al. | 250/370.11 |
| 6,353,229 B1 | 3/2002 | Polischuk et al. | |
| 6,437,339 B2 | 8/2002 | Lee et al. | |
| 6,546,075 B1 | 4/2003 | Chartier et al. | |
| 6,559,038 B2 | 5/2003 | Nikolaev et al. | |
| 6,665,374 B2 * | 12/2003 | Izumi et al. | 379/40 |
| 6,781,131 B2 | 8/2004 | Kusuyama et al. | |
| 7,115,878 B2 * | 10/2006 | Ikeda et al. | 250/370.09 |
| 7,122,803 B2 | 10/2006 | Jing et al. | |
| 2001/0008271 A1 * | 7/2001 | Ikeda et al. | 250/370.09 |
| 2003/0038306 A1 * | 2/2003 | Izumi et al. | 257/222 |
| 2004/0178426 A1 | 9/2004 | Melekhov et al. | |
| 2005/0056829 A1 | 3/2005 | Green et al. | |
| 2005/0082491 A1 | 4/2005 | Seppi et al. | |
| 2006/0063351 A1 * | 3/2006 | Jain | 438/455 |
| 2007/0085112 A1 * | 4/2007 | Yamazaki et al. | 257/288 |
| 2007/0121211 A1 * | 5/2007 | Watanabe et al. | 359/601 |

FOREIGN PATENT DOCUMENTS

| | | |
|---|---|---|
| JP | 2002-189226 | 7/2002 |
| JP | 2002189226 * | 7/2002 |
| JP | 2002189226 A * | 7/2002 |
| JP | 2003209238 A * | 7/2003 |
| WO | WO 02/067014 A1 | 8/2002 |

OTHER PUBLICATIONS

"Lead Iodide Optical Detectors for Gamma Ray Spectroscopy", Shah et al., IEEE Transactions on Nuclear Science, vol. 44, No. 3, Jun. 1977. (pp. 448-450).*

* cited by examiner

CORROSION BARRIER LAYER FOR PHOTOCONDUCTIVE X-RAY IMAGERS

FIELD OF THE INVENTION

This invention relates to imaging X-ray detectors.

BACKGROUND

X-ray detectors providing an imaging capability are presently being extensively investigated as an alternative to conventional film-based radiography. Flat panel imaging X-ray detectors are of particular interest, due to their compact size and compatibility with large scale electronic circuit processing. For example, thin film transistor (TFT) technology is often employed to fabricate the active device or devices for each detector pixel, since TFT technology is a cost effective method of providing a large array of electronic devices. An array of TFT devices having separated pixel electrodes can be employed to define the pixels of an X-ray imager, and X-ray sensitive material can be disposed on the pixel electrodes, typically as continuous film covering the entire array, to provide sensitivity to X-rays.

It is convenient to classify X-ray detectors as direct detectors or indirect detectors, according to the kind of response the X-ray sensitive material provides. If the X-ray sensitive material emits light in response to incident X-rays (i.e., its response is by optical scintillation), the resulting X-ray detector is indirect. The underlying active circuitry responds to the light emitted by the X-ray sensitive material. If the X-ray sensitive material emits charge carriers (e.g., electron-hole pairs), the resulting X-ray detector is direct. The underlying active circuitry responds to the electrical changes in the X-ray sensitive material.

It is well known in the art that X-ray sensitive materials tend to be corrosive, so in practice it is necessary to protect the active circuitry from the corrosive effects of the X-ray detector material. Corrosion is a particularly acute problem for direct imaging X-ray detectors, because some effective methods for protecting the active circuitry from corrosion are not compatible with the requirement that the active circuitry be responsive to electrical changes in the X-ray detector material. For example, a thick insulating barrier layer would be undesirable for a direct imaging X-ray detector, while it could work well for an indirect imaging X-ray detector if it is sufficiently transparent. Since direct detection is often preferred to avoid image blurring due to optical scatter in indirect detection, as well as other possible artifacts of indirect detection, reducing corrosion in direct imaging X-ray detectors is of particular interest.

One approach for corrosion mitigation that has been considered is the use of corrosion-resistant pixel electrodes, e.g., as suggested in U.S. Pat. No. 7,115,878. For example, indium tin oxide (ITO) is sufficiently corrosion-resistant for many X-ray imager applications, and it is compatible with TFT technology. However, if any pinholes are present in the ITO pixel electrodes, corrosion can initiate. Once such corrosion is initiated, it often proceeds to complete destruction of the affected circuitry, especially if it includes aluminum. A corrosion-resistant guard ring structure for a detector array as a whole is considered in U.S. Pat. No. 6,037,609. However, it is important to prevent corrosion throughout the array, not just at its edges. Another approach that has been considered, in US 2005/0056829, is the use of a multi-layer structure for the X-ray detector material, where more chemically reactive photoconductor material (e.g., $HgI_2$) is sandwiched between layers of less chemically reactive photoconductor material (e.g., $PbI_2$). The less chemically reactive material can protect the other components from the more chemically reactive material. However, in this example, $HgI_2$ provides improved detection performance compared to $PbI_2$, so it would be preferable to eliminate the $PbI_2$ from the detector.

The structure of US 2005/0056829 can be regarded as providing a photoconductive barrier layer to protect the active circuitry from corrosion. Such barrier layers can also be electrically insulating or electrically conductive. Electrically insulating barrier layers entail readout via capacitive coupling, which incurs various disadvantages such as slow readout, difficult reset process (e.g., one possibility is optical reset), and signal loss. Electrically conductive barrier layers avoid the disadvantages of capacitive coupling, but can introduce undesirable cross talk from pixel to pixel via lateral conduction. One approach that has been considered for reducing this cross talk is incorporation of conductive particles into an otherwise insulating film such that vertical conductivity is substantially greater than lateral conductivity. For example, carbon particles can be employed. However, excess electrical noise can be introduced by this approach, since the contact from particle to particle is not necessarily stable or perfect.

Barrier layers have also been considered in the art for purposes other than corrosion reduction. For example, amorphous Se X-ray detectors are typically operated at a high electrical bias field (e.g., on the order of 10 V/μm). For these detectors, an insulating barrier layer at one or both electrodes can be helpful for reducing dark current and for increasing breakdown voltage. In US 2001/0008271, organic semiconductor barrier layers are employed to provide ohmic contact and to reduce dark current.

Accordingly, it would be an advance in the art to provide imaging X-ray detectors having improved corrosion resistance.

SUMMARY

Improved corrosion resistance for direct X-ray imaging detectors is obtained by providing a pixelated, electrically conductive barrier layer between the X-ray sensitive material and the pixel electrodes. Each barrier layer can cover part or all of its corresponding pixel electrode. In cases where pixel electrodes makes contact to underlying circuitry through vertical vias, it is preferred for the barrier layers to cover the via sections of the pixel electrodes. The barrier layers for each pixel electrode can be spaced apart from each other, or they can all be included within a continuous film on top of the pixel electrodes. Such a continuous film can be pixelated by spatially modulating its properties (e.g., thickness, doping) to significantly reduce lateral conductivity from pixel to pixel.

Practice of the invention provides several advantages. The use of a conductive barrier layer avoids the disadvantages of an insulating barrier layer (e.g., reduced response time, more complicated reset process). The barrier layer can be made sufficiently thin that subsequent deposition of the X-ray sensitive material is not significantly affected. An important example of this is growth of $HgI_2$ detector material on amorphous silicon barrier layers. No embedded conductive particles are present in the barrier layers, thereby avoiding disadvantages such as increased pixel-to-pixel inhomogeneity and instability (e.g. flashing) associated with embedded conductive particles.

DETAILED DESCRIPTION

Figure 1:
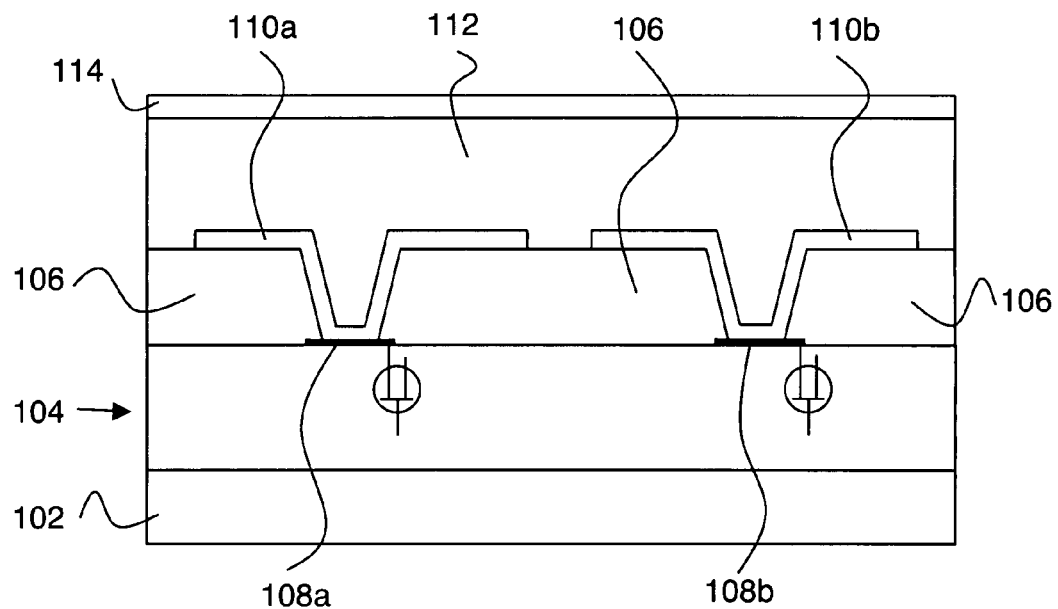
FIG. 1 shows a side view of a conventional imaging X-ray detector.

FIG. 1 shows a side view of a conventional direct imaging X-ray detector. In this example, an insulating substrate 102 provides support for an electronics layer 104. Two adjacent device electrodes of electronics layer 104 are shown as 108a and 108b. Pixel electrodes 110a and 110b connect to device electrodes 108a and 108b, respectively. The pixel electrodes have shapes selected to define the pixel array provided by the detector (e.g., an array of squares separated from each other by small gaps in a top view). The pixel electrodes make contact to their respective device electrodes by way of vertical vias through an insulator 106 that otherwise separates the pixel electrodes from electronics layer 104. An X-ray sensitive photoconductive material 112 is disposed on top of insulator 106 and the pixel electrodes. A common top electrode 114, transparent to X-rays, enables electrical bias to be applied to X-ray sensitive material 112. X-rays incident on this detector cause electrical charges to be generated in X-ray sensitive material 112, at least some of which are received by the pixel electrodes, thereby providing direct X-ray detection.

In this conventional X-ray detector structure, the X-ray sensitive material 112 is in contact with insulator 106 and with the pixel electrodes. Accordingly, the pixel electrodes and insulator 106 should be made of materials which resist corrosion induced by X-ray sensitive material 112. However, we have found that this conventional approach does not address certain problems that arise in practice. In particular, pinholes may be present in the pixel electrodes, and such pinholes may allow direct contact between X-ray sensitive material 112 and the device electrodes of electronics layer 104. Since these device electrodes are typically made of reactive materials (e.g., Al device electrodes under indium tin oxide (ITO) pixel electrodes), significant corrosion through pinholes of the pixel electrode can occur, often leading to complete destruction of the affected circuitry.

To alleviate this problem, the present invention provides pixelated electrically conductive chemical barrier layers between the pixel electrodes and the X-ray sensitive material.

Figure 2:
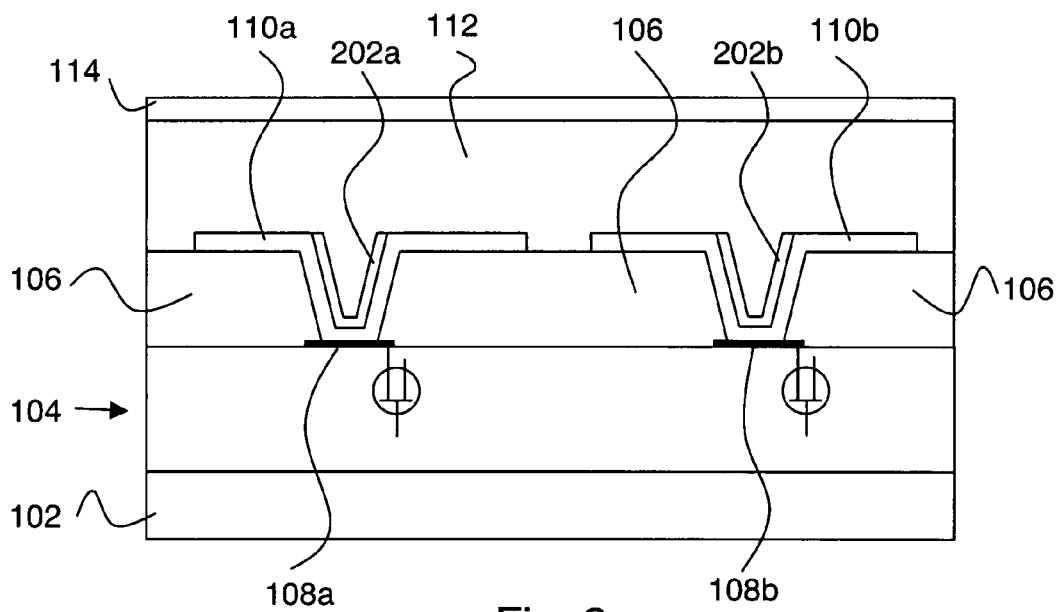
FIG. 2 shows a side view of an imaging X-ray detector according to a first embodiment of the invention.

FIG. 2 shows a side view of an imaging X-ray detector according to a first embodiment of the invention. In this embodiment, chemical barrier layers 202a and 202b are disposed in the vias of insulator 106 between pixel electrodes 110a and 110b and X-ray sensitive material 112. Chemical barrier layers 202a and 202b are preferably made from inorganic material, and are more preferably made from amorphous silicon (n-type, p-type or undoped). Other suitable barrier layer materials include, but are not limited to: column IV elemental or compound semiconductors (e.g., SiC), III-V compound semiconductors and II-VI compound semiconductors. Barrier layer materials can be undoped, p-type or n-type. Barrier layer materials can also be amorphous, single-crystal, poly-crystalline or micro-crystalline. Since chemical reactivity tends to increase as one moves away from column IV materials, column IV material are preferred for the barrier layers. The chemical barrier layers are electrically conductive, and preferably have a higher conductivity than X-ray sensitive material 112 so that current flow responsive to incident X-rays is not significantly affected by the chemical barrier layers. The chemical barrier layers are resistant to corrosion induced by X-ray sensitive material 112, and are preferably deposited in such a manner as to reduce or eliminate pinholes. Although the specific deposition technology employed for depositing the chemical barrier layers is not critical in practicing the invention, plasma enhanced chemical vapor deposition (PECVD, e.g., as commonly practiced using standard equipment in the flat panel industry, is a suitable method for depositing the chemical barrier layers. Doping can be performed by adding percent quantities of dopants (e.g., phosphorous or boron for n-type or p-type doping, respectively) in gas phase during deposition. Amorphous silicon (a-Si) barrier layers can also be alloyed (e.g., with hydrogen, carbon or germanium). Alloyed a-Si barrier layers can be doped in much the same way as unalloyed a-Si barrier layers. Other suitable deposition methods for the barrier layers include, but are not limited to, particle in binder (PIB) techniques, and spin-on techniques. PIB layers can be deposited by various known methods, including but not limited to screen printing. In this manner, enhanced protection is provided to the electronic devices from corrosion induced by the X-ray sensitive material. More specifically, such protection is provided at the most critical point in the structure, since a pinhole through a pixel electrode is most damaging if it is located at or near the bottom of a via, so that it can expose circuitry to the X-ray sensitive material.

Practice of the invention does not depend critically on structural details of electronics layer 104, or on the compositions of X-ray sensitive material 112, insulator 106, substrate 102, and pixel electrodes 110a,b. Suitable substrates 102 can be rigid or flexible, and preferably are electrically insulating (e.g., glass or plastic). Electronics layer 104 can include any array of two or more electronic devices responsive to charges received at the pixel electrodes. Amorphous silicon thin film transistor (TFT) technology is a preferred technology for electronics layer 104. Suitable materials for insulator 106 include, but are not limited to: PECVD deposited insulators such as $Si_xN_y$, $SiO_xN_y$, and $SiO_x$, and spun-on dielectric layers such as polyamide, polyamide+Si, and polysiloxyane.

The pixel electrodes are preferably corrosion resistant. Indium tin oxide (ITO) is presently preferred as a pixel electrode material, since it also acts as a barrier layer to prevent corrosion. In some embodiments, the chemical barrier layer may provide sufficiently complete corrosion protection that the need to have corrosion-resistant pixel electrodes is reduced or eliminated. In such cases, the pixel electrode material can be any material that is compatible with the overall fabrication process. For example, if PECVD deposition is employed, Al pixel electrodes should be avoided due to hillock formation during high-temperature PECVD processing. Pixel electrode materials preferably do not form an insulating native oxide on contact with air. Formation of a conductive native oxide on contact with air is not of concern. Chemical reactions of the pixel electrode material during processing (e.g., during PECVD) are also undesirable. Accordingly, metals commonly employed in flat panel displays (FPDs), which satisfy the above-mentioned compatibility constraints with respect to standard FPD processing methods, such as Cr, Ta, Ti, Mo, and MoN, are also suitable pixel electrode materials in embodiments of the invention. Suitable X-ray sensitive materials 112 include, but are not limited to: $HgI_2$, amorphous selenium, PbI2, CdS, BiI, TlBr, and HgBrI.

Figure 3:
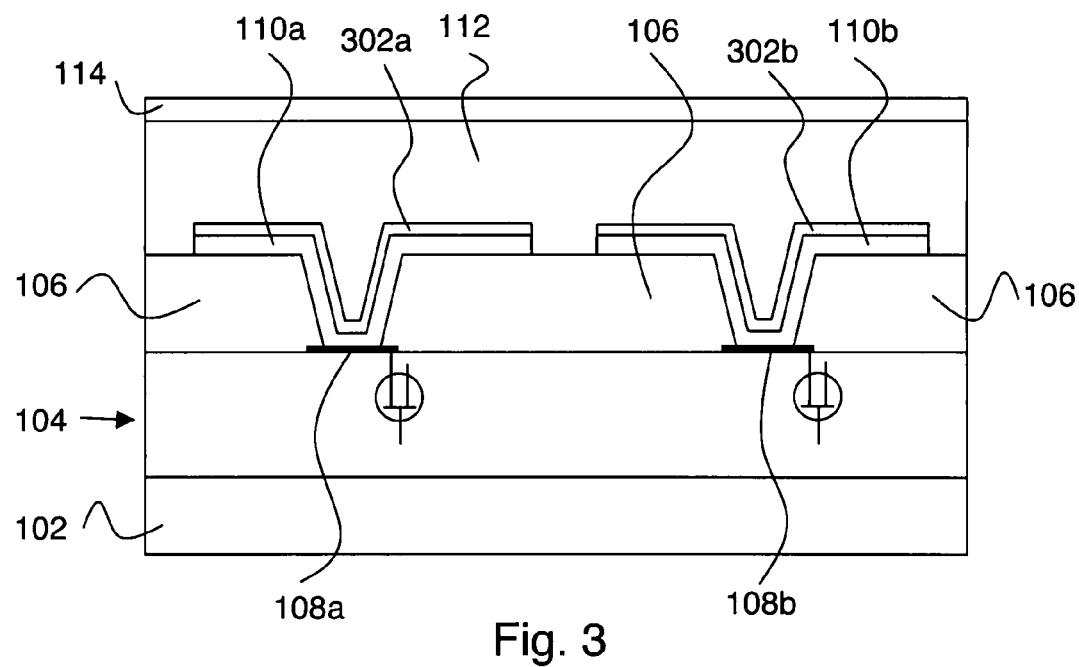
FIG. 3 shows a side view of an imaging X-ray detector according to a second embodiment of the invention.

FIG. 3 shows a side view of an imaging X-ray detector according to a second embodiment of the invention. This embodiment is similar to the embodiment of FIG. 2, except that barrier layers 302a and 302b are co-extensive with the corresponding pixel electrodes 110a and 110b. This approach provides improved corrosion resistance over the entire area of the pixel electrodes, which is typically at least 80% of the total sensor array area. A further advantage of this approach is that the same mask can be employed to define the pixel electrode pattern and the chemical barrier layer pattern during photolithographic fabrication.

Figure 4:
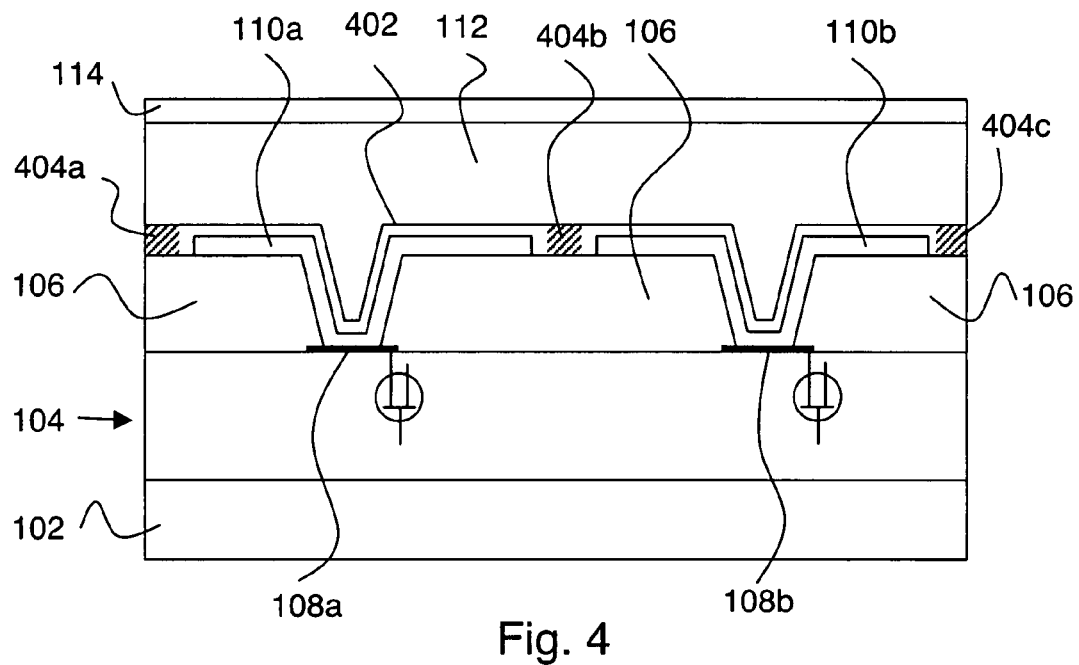
FIG. 4 shows a side view of an imaging X-ray detector according to a third embodiment of the invention.

FIG. 4 shows a side view of an imaging X-ray detector according to a third embodiment of the invention. This embodiment is similar to the previous embodiments, except that barrier layer 402 is a continuous film covering the pixel electrodes. In contrast, the previous embodiments have barrier layers for each pixel electrode that are spaced apart from each other. In this embodiment, it is important to reduce electrical conductivity between pixel electrodes, so that barrier layer 402 does not act to "short" the pixels together. One or more properties (e.g., doping, thickness, and other deposition parameters) of barrier layer 402 can be spatially modulated to provide such reduced lateral conductivity. These modulated regions are schematically shown as 404a,b,c on FIG. 4.

The invention claimed is:

1. Apparatus for imaging X-rays, the apparatus comprising:
    a substrate;
    an array of two or more electronic devices disposed on a top surface of the substrate, wherein each of the electronic devices has a corresponding pixel electrode facing away from the substrate, and wherein each of the electronic devices includes an electrically conductive chemical barrier layer covering part or all of the corresponding pixel electrode;
    a layer of photoconductive material disposed on top of the array of electronic devices, wherein the photoconductive material provides electric charges responsive to incident X-rays, and wherein at least some of the electric charges are received by one or more of the pixel electrodes;
    wherein the chemical barrier layers comprise amorphous silicon and wherein the chemical barrier layers are disposed between the pixel electrodes and the photoconductive material;
    whereby the chemical barrier layers provide improved protection of the electronic devices from corrosion induced by the photoconductive material.

2. The apparatus of claim 1, wherein said barrier layers for each of said pixel electrodes are spaced apart from each other.

3. The apparatus of claim 2, wherein each of said barrier layers is co-extensive with its corresponding one of said pixel electrodes.

4. The apparatus of claim 1 wherein each of said pixel electrodes makes contact with its corresponding one of said electronic devices by way of a vertical via through an insulating layer disposed between said array of said electronic devices and said pixel electrodes.

5. The apparatus of claim 4, wherein said barrier layers for each of said pixel electrodes are disposed in said vias.

6. The apparatus of claim 1, wherein said barrier layers for each of said pixel electrodes are included in a single continuous film covering said pixel electrodes.

7. The apparatus of claim 6, wherein one or more properties of said film are spatially modulated to reduce electrical conductivity between adjacent ones of said pixel electrodes.

8. The apparatus of claim 1, wherein said amorphous silicon is undoped, doped p-type, or doped n-type.

9. The apparatus of claim 1, wherein said photoconductive material comprises a material selected from the group consisting of $HgI_2$, amorphous selenium, $PbI_2$, CdS, BiI, TlBr, and HgBrI.

10. The apparatus of claim 1, wherein an electrical conductivity of said chemical barrier layers is substantially greater than an electrical conductivity of said photoconductive material.

11. The apparatus of claim 1, wherein said pixel electrodes comprise a material selected from the group consisting of indium tin oxide (ITO), Cr, Ta, Ti, Mo, and MoN.

12. The apparatus of claim 1, wherein electrical conductivity from any one of said chemical barrier layers to any other of said chemical barrier layers is negligible.

13. Apparatus for imaging X-rays, the apparatus comprising:
    a substrate;
    an array of two or more electronic devices disposed on a top surface of the substrate, wherein each of the electronic devices has a corresponding pixel electrode facing away from the substrate, and wherein each of the electronic devices includes an electrically conductive chemical barrier layer covering part or all of the corresponding pixel electrode;
    a layer of photoconductive material disposed on top of the array of electronic devices, wherein the photoconductive material provides electric charges responsive to incident X-rays, and wherein at least some of the electric charges are received by one or more of the pixel electrodes;
    wherein the chemical barrier layers are disposed between the pixel electrodes and the photoconductive material;
    wherein said barrier layers for each of said pixel electrodes are included in a continuous film covering said pixel electrodes;
    wherein one or more properties of said continuous film are spatially modulated to reduce electrical conductivity between adjacent ones of said pixel electrodes;
    whereby the chemical barrier layers provide improved protection of the electronic devices from corrosion induced by the photoconductive material.

* * * * *